(12) United States Patent
Huang

(10) Patent No.: US 9,331,069 B2
(45) Date of Patent: May 3, 2016

(54) RESISTOR MEMORY BIT-CELL AND CIRCUITRY AND METHOD OF MAKING THE SAME

(71) Applicant: SEMICONDUCTOR MANUFACTURING INTERNATIONAL (SHANGHAI) CORPORATION, Shanghai (CN)

(72) Inventor: Herb He Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/826,184

(22) Filed: Aug. 13, 2015

(65) Prior Publication Data

US 2015/0349024 A1 Dec. 3, 2015

Related U.S. Application Data

(62) Division of application No. 14/249,315, filed on Apr. 9, 2014, now Pat. No. 9,129,831.

(51) Int. Cl.
*H01L 27/06* (2006.01)
*H01L 45/00* (2006.01)
(Continued)

(52) U.S. Cl.
CPC ...... *H01L 27/0694* (2013.01); *H01L 21/26533* (2013.01); *H01L 21/76898* (2013.01); *H01L 27/101* (2013.01); *H01L 27/1112* (2013.01); *H01L 27/2436* (2013.01); *H01L 27/2463* (2013.01); *H01L 29/0847* (2013.01); *H01L 29/4175* (2013.01); *H01L 29/45* (2013.01); *H01L 29/4975* (2013.01); *H01L 45/02* (2013.01); *H01L 45/06* (2013.01); *H01L 45/08* (2013.01); *H01L 45/128* (2013.01);
(Continued)

(58) Field of Classification Search
CPC ............ H01L 27/0694; H01L 27/1112; H01L 27/2436; H01L 27/2463; H01L 27/228; H01L 45/1253; H01L 45/1608; H01L 45/144; H01L 45/02; H01L 45/06; H01L 45/08; H01L 45/128; H01L 45/1233; H01L 29/0847; H01L 29/45; H01L 29/4975
USPC ....................................................... 257/378
See application file for complete search history.

(56) References Cited

U.S. PATENT DOCUMENTS 6,380,028 B1 * 4/2002 Kim .................. H01L 27/10855
257/E21.649
8,822,337 B2 * 9/2014 Zhu ................... H01L 21/76898
257/52

(Continued)

*Primary Examiner* — Allan R Wilson
(74) *Attorney, Agent, or Firm* — Kilpatrick Townsend & Stockton LLP

(57) ABSTRACT

A resistive memory cell control unit, integrated circuit, and method are described herein. The resistive memory cell control unit includes a switching transistor and a resistive memory cell. The switching transistor includes a gate disposed on a first surface of a semiconductor substrate, a source, and a drain each disposed in the semiconductor substrate, a gate terminal disposed on the first surface and connected to the gate, a source terminal disposed on the first surface and connected to the source, and a drain terminal connected to the drain and disposed on a second surface opposite the first surface. The resistive memory cell is disposed on the second surface and has a first end connected to the drain terminal. The structure provides a small area and simple manufacturing process for a resistive memory cell integrated circuit.

19 Claims, 4 Drawing Sheets

(51) Int. Cl.
*H01L 27/11* (2006.01)
*H01L 45/02* (2006.01)
*H01L 27/24* (2006.01)
*H01L 29/45* (2006.01)
*H01L 29/49* (2006.01)
*H01L 29/08* (2006.01)
*H01L 27/10* (2006.01)
*H01L 21/768* (2006.01)
*H01L 21/265* (2006.01)
*H01L 29/417* (2006.01)
*H01L 27/22* (2006.01)

(52) U.S. Cl.
CPC ........ *H01L45/1233* (2013.01); *H01L 45/1253* (2013.01); *H01L 45/144* (2013.01); *H01L 45/1608* (2013.01); *H01L 27/228* (2013.01)

(56) References Cited

U.S. PATENT DOCUMENTS

| | | | |
|---|---|---|---|
| 8,901,526 B2* | 12/2014 | Nam | H01L 27/228 257/1 |
| 9,053,964 B2* | 6/2015 | Jeon | H01L 21/8252 |
| 2006/0022280 A1* | 2/2006 | Cabral | H01L 21/28097 257/382 |
| 2008/0042118 A1* | 2/2008 | Hayakawa | G11C 13/0004 257/4 |
| 2009/0085128 A1* | 4/2009 | Nakamura | H01L 21/823481 257/396 |
| 2011/0068475 A1* | 3/2011 | de Fresart | H01L 21/76876 257/774 |
| 2013/0051115 A1* | 2/2013 | En | H01L 27/0694 365/148 |
| 2014/0264235 A1* | 9/2014 | Gong | H01L 23/5386 257/4 |

* cited by examiner

RESISTOR MEMORY BIT-CELL AND CIRCUITRY AND METHOD OF MAKING THE SAME

CROSS-REFERENCES TO RELATED APPLICATIONS

This application is a divisional application of U.S. patent application Ser. No. 14/249,315, filed Apr. 9, 2014, which claims priority to Chinese Application No. 201310455095.1, filed on Sep. 27, 2013 with the State Intellectual Property Office of People's Republic of China, the contents of both of which are incorporated herein by reference in its entirety.

FILED OF THE INVENTION

The present invention relates to semiconductor memory devices. More particularly, embodiments of the present invention provide a resistor memory bit cell structure, integrated circuit, and method of manufacturing the same.

BACKGROUND OF THE INVENTION

Memory devices are utilized as non-volatile memory for a wide range of electronic applications. Resistive memory devices may include an array of resistive memory cells and a corresponding array of switching transistors. Typically, a switching transistor and an associated resistive memory cell form a semiconductor memory control unit. A plurality of semiconductor memory control units complemented with other sub-circuits having a specific function may be configured to form an integrated circuit memory array. The switching transistor may be a field effect transistor, and in particular a metal oxide semiconductor field effect transistor (MOS FET). In a memory control unit or integrated circuit of a conventional semiconductor memory array, a switching transistor generally includes a source terminal, a drain terminal, and a gate terminal. The drain terminal is connected to the resistive memory cell. In addition, the source, drain, and gate of the switching transistor, their respective terminals, and the resistive memory cell are disposed on the same side of the semiconductor substrate.

With the increase in storage density and decrease in the semiconductor process technology node, the feature size of transistors, resistors and other semiconductor memory cell storage control units (alternatively referred to as storage units) has been continuously reduced. Accordingly, the distance (spacing) between gate and drain is becoming smaller, resulting in an increase of difficulty in manufacturing processes and coupling capacitance. Furthermore, because the contact holes and contacts of the source and drain electrodes are disposed on the same side of the substrate, the value of coupling capacitance between metal plugs of the gate and source and drain electrodes also increases.

The continuous increase in coupling capacitance between the gate and source/drain seriously affects the performance of the transistor, thereby affecting the performance of the integrated circuit. While a prior art fin-type field effect transistor (Fin FET) device can solve the problem of coupling capacitor to a certain extent, but as device dimensions continue to shrink, the performance of such Fin FET device may become adversely affected. The resistive memory cell array as a memory integrated circuit interconnected with row select and column select lines, source electrodes, drain electrodes, and gate electrodes of associated switching transistors and the corresponding connection terminals embedded in the same side of an interlayer dielectric layer are submitted to an thermal annealing process that may adversely affect the production yield. There are undoubtedly manufacturing difficulties in the integration process of the memory array circuit. For example, the quality of solid-state resistance change memory devices, such as thermal phase-change storage device (PCRAM), magnetoresistive memory device (Magnetic RAM) and variable resistor voltage sensitive device (ReRAM) are not suitable for post high temperature heat treatment processes.

Therefore, to solve the above problems, the present invention provides a novel semiconductor memory control unit, an integrated circuit using the semiconductor memory control unit, and method of manufacturing the integrated circuit.

BRIEF SUMMARY OF THE INVENTION

Embodiments of the present invention provide novel structures of a semiconductor memory control unit and methods for manufacturing a resistive memory cell. In an embodiment, a semiconductor memory control unit includes a switching transistor and a resistive memory cell. The switching transistor includes a gate disposed on a first surface of a semiconductor substrate, a source, and a drain each disposed in the semiconductor substrate, a gate terminal disposed on the first surface and connected to the gate. The semiconductor memory control unit further includes a source terminal disposed on the first surface and connected to the source, a drain terminal disposed on a second surface that is opposite the first surface. The drain terminal is connected to the drain. The resistive memory cell is disposed on the second surface and has a first end connected to the drain terminal.

In another embodiment, there is provided a method for manufacturing an integrated circuit. The method includes providing a semiconductor substrate having a first surface and an opposite second surface, and forming a shallow trench isolation in the first surface of the semiconductor substrate. The method also includes forming a gate of a switching transistor on the first surface, forming a source and a drain of the switching transistor in the semiconductor substrate, forming on the first surface a gate terminal connected to the gate and a source terminal connected to the source. The method further includes forming a carrier substrate on the first surface, performing a thinning process on the second surface until a surface of the shallow trench isolation is exposed, forming on the thinned second surface a drain terminal connected to the drain, and forming on the thinned second surface a resistive memory cell having a first end connected to the drain terminal.

In an embodiment, the method further includes concurrently forming a body electrode together with the gate terminal and the source terminal.

In an embodiment, the method also includes, after forming the gate terminal and source terminal and prior to forming the carrier substrate, forming on the first surface a row wire connecting the gate terminals that are formed in the same row, and forming on the first surface a column wire connecting the source terminals that are formed in the same column.

In an embodiment, the method also includes, after performing the thinning of the second surface and prior to forming the drain terminal, performing an ion implantation onto a drain portion in the second surface of the semiconductor substrate and subjecting the semiconductor substrate to a thermal annealing treatment.

In an embodiment, the method includes forming a stop layer on the first surface of the semiconductor substrate prior to forming the shallow trench isolation.

In an embodiment, the method includes performing an ion implantation onto the first surface to form a well and a channel after forming the shallow trench isolation and prior to forming a gate of a switching transistor.

In an embodiment, the method includes etching the second surface to form a first trench and forming a planar interlayer dielectric layer on the second surface after forming the drain terminal and prior to forming the resistive memory cell.

In an embodiment, the method includes forming a silicon via in the first trench after forming the resistive memory cell.

In an embodiment, the method includes forming an interlayer dielectric layer on the second surface, forming a contact hole in the interlayer dielectric layer, forming a metal plug in the contact hole, and connecting the drain terminal to the first end of the resistive memory cell through the metal plug.

In an embodiment, the method includes, after forming the resistive memory cell, forming a second end of the resistive memory cell on the second surface.

DETAILED DESCRIPTION OF THE INVENTION

Figure 1:
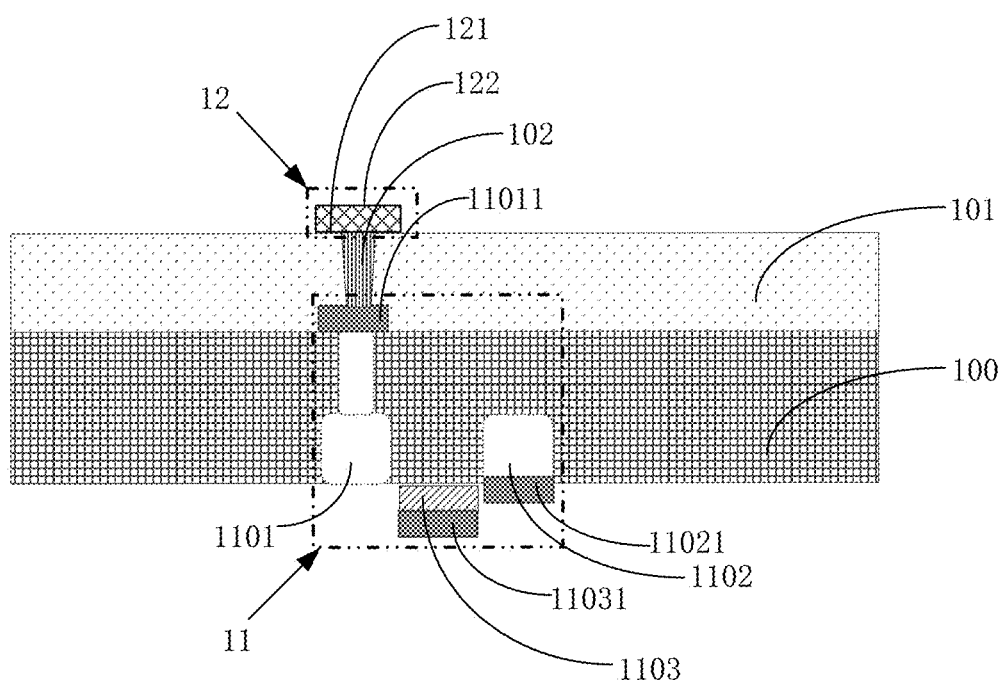
FIG. 1 is a simplified cross-sectional view of a control unit of a semiconductor memory according to a first embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

First Embodiment

According to a first embodiment, a semiconductor memory control unit includes a switching transistor disposed on a first surface of a semiconductor substrate and a resistive memory cell disposed on an opposite second surface of the semiconductor substrate. The switching transistor includes agate electrode on the first surface (upper surface) of the semiconductor substrate, a source electrode, and a drain electrode disposed in the semiconductor substrate. The switching transistor also includes, on the first surface, a source terminal connected to the source electrode and agate terminal connected to the gate electrode. The switching transistor further includes, on the second surface (lower surface) of the semiconductor substrate, a drain terminal connected to the drain electrode. The resistive memory cell has a first end that is connected to the drain electrode through the drain terminal of the switching transistor.

The structure of the semiconductor memory control unit according to an embodiment of present invention will be described in detail below. FIG. 1 is a simplified cross-sectional view of a semiconductor memory control unit according to a first embodiment of the present invention.

Referring to FIG. 1, a semiconductor memory control unit according to the first embodiment includes a semiconductor substrate 100, a switching transistor 11 and a resistive storage unit 12 on semiconductor substrate 100. Switching transistor 11 includes a gate electrode 1103 disposed on a first surface (e.g., an upper surface) of semiconductor substrate 100, a source electrode 1102 and a drain electrode 1101 disposed within semiconductor substrate 100. Switching transistor 11 further includes, on the first surface of the semiconductor substrate, a source terminal 11021 connected to source electrode 1102 and a gate terminal 11031 connected to gate electrode 1103. Switching transistor 11 also includes, on a second surface (e.g., a lower surface) of the semiconductor substrate, a drain terminal 11011 connected to drain electrode 1101. Resistive memory cell 12 is disposed on the second surface and includes a first end 121 that is connected to the drain electrode 1101 through the drain terminal 11011. Generally, first end 121 of resistive memory cell 12 may be connected to drain terminal 11011 through a metal plug 102.

In an embodiment, the resistive memory cell 12 may include a second end 122. Second end 122 is opposite first end 121 and is configured to supply a reference voltage to the resistive memory cell 12.

In the example shown in FIG. 1, drain electrode 1101 includes a first drain portion (a wide portion) in the vicinity of the first surface and a second drain portion (a narrow portion) in the vicinity of the second surface. The first drain portion and the second drain portion are formed by performing an ion implantation onto the first and second surfaces of the semiconductor substrate 100. Source electrode 1102 may be disposed only in the vicinity of the first surface of semiconductor substrate 100, as shown in FIG. 1, or source electrode 1102 may also be the same structure as the structure of drain electrode 1101 (i.e., including a first portion in the vicinity of the first surface and a second portion in the vicinity of the second surface). In an embodiment, the drain electrode can be a unitary structure formed by deep ion implantation onto the first surface toward the second surface of the semiconductor substrate 100.

In this embodiment, source terminal 11021, drain terminal 11011, and gate terminal 11031 may be a metal silicide. In addition, source terminal 11021, drain terminal 11011, and gate terminal 11031 may also be copper, aluminum and other metals or ions doped regions. In this embodiment, source terminal 11021, drain terminal 11011, and gate terminal 11031 may not be present, and source electrode 1102, drain electrode 1101, and gate electrode 1103 represent connections to other portions of the resistive memory cell. Gate or gate electrode, source or source electrode, and drain or drain electrode will be used alternatively hereinafter.

Because drain terminal 11011 and gate 1103 of switching transistor 11 are disposed on opposite surfaces of semiconductor substrate 100, coupling capacitance between the drain and the gate can be reduced, so that the performance of the switching transistor and the performance of the semiconductor memory control unit can be improved.

In this embodiment, switching transistor 11 can also include a body electrode (not shown in FIG. 1), the body electrode of the semiconductor substrate can be disposed on the first surface (upper surface) or the second surface (lower surface). In an exemplary embodiment, the body electrode is disposed on the first surface of the semiconductor substrate 100. The body electrode may be a metal, a metal silicide, or other suitable materials. The body electrode may be a fourth terminal of the switching transistor, which is connected to a gate, a source, and a drain of the semiconductor substrate. When the switching transistor is implanted in an integrated circuit, the body electrode may be used to modulate the operation of the transistor. In the integrated circuit, the body electrode of the switching transistor (also called body-side electrode) is generally connected to the highest or lowest voltage level.

In this embodiment, resistive memory cell 12 may include a thermal phase change memory element with electric heating, a variable resistance memory element sensitive to voltage modulation, or a magnetoresistive memory element. When resistive memory cell 12 is a thermal heating phase-change memory element with electric heating, the thermal phase-change memory element material may be an alloy of germanium antimony tellurium. When resistive memory cell 12 is a magnetoresistive element, the resistive memory cell may be a magnetic tunnel junction device.

In an embodiment, resistive memory cell 12 is disposed on a dielectric layer 101, as shown in FIG. 1. The semiconductor storage control unit may further include a gate insulating layer, sidewall spacers, and lightly doped regions (not shown in FIG. 1). The gate insulating layer, sidewall spacers, and lightly doped regions can be implemented with a variety of conventional processes and will not be described herein for the sake of brevity.

According to an embodiment of the present invention, gate terminal 11031 and source terminal 11021 of switching transistor 11 are disposed on one side (first surface) of semiconductor substrate 100, and drain terminal 11011 of switching transistor 11 is disposed on the opposite side (second surface) of semiconductor substrate 100, this arrangement effectively reduces the coupling capacitance between the gate electrode and the drain electrode and the size of the semiconductor memory control unit. Furthermore, by disposing the resistive memory cell on one side and the gate connection terminal and the source connection terminal and their respective interconnects (not shown in FIG. 1) on an opposite side of the semiconductor substrate, conflicting requirements caused by processing the resistive memory cell and the source terminal can be resolved, adverse effects of subsequent processes of the resistive memory cell can be avoided, and the yield of the semiconductor memory control unit can be improved.

Embodiments of the present invention also provide a method of manufacturing a semiconductor memory control unit. The method includes the following steps:

Step E101: providing a first semiconductor substrate 100 having a first surface (upper surface and a second surface (lower surface) opposite the first surface; forming a gate structure on the first surface of first semiconductor substrate 100, the gate structure includes a gate insulating layer, a gate electrode and a gate sidewall.

Step E102: forming a source electrode 1102 and a drain electrode 1101 in ti vicinity of the first surface of semiconductor substrate 100.

In an embodiment, source electrode 1102 may be an integral structure disposed in the vicinity of a first surface region, drain electrode 1101 includes a first drain electrode portion disposed in the vicinity of the first surface and a second drain portion disposed in the vicinity of the second surface of semiconductor substrate 100. Step E102 may include the following steps:

Step E1021: performing a first ion implantation onto the first surface (upper surface) of first semiconductor substrate 100 to form the source electrode and the first portion of the drain electrode;

Step E1022: performing a second ion implantation onto the second surface (lower surface) of first semiconductor substrate 100 to form the second portion of the drain electrode. FIG. 1 shows a resulting structure according to an exemplary embodiment.

In an embodiment, the drain electrode may be a unitary structure, that can be obtained by a deep ion implantation from the first surface towards the second surface of first semiconductor substrate 100.

Step E103: forming drain terminal 11011 on the second surface of semiconductor substrate 100.

Step E104: forming gate terminal 11031 on gate electrode 1103 and forming source terminal 11021 on source electrode 1102.

Step E105: forming a dielectric layer 101 on the second surface of semiconductor substrate 100, and forming a contact hole in dielectric layer 101 to expose a top surface of drain terminal 11021, and forming a metal plug 102 in the contact hole.

Step E106: forming resistive memory cell 12 on dielectric layer 101. Resistive memory cell 12 has a first end 121 connected to metal plug 102.

In an embodiment, step E101 may further include forming a lightly doped region.

In an embodiment, source terminal 11021, drain terminal 11011, and gate terminal 11031 can be a metal, a metal silicide, or other suitable materials.

A semiconductor memory unit having a memory control unit fabricated using the method described above will obtain many advantages and benefits of low coupling capacitance between the gate and drain of the switching transistor and better performance of the memory control unit.

Second Embodiment

According to a second embodiment of the present invention, there is provided an integrated circuit. The integrated circuit includes an array of semiconductor memory control units, each of the control units includes a switching transistor having reduced coupling capacitance between the gate and drain due to the disposition of gate and drain on opposite sides of the substrate. Accordingly, the switching transistor has a reduced physical size and better performance.

Figure 2:
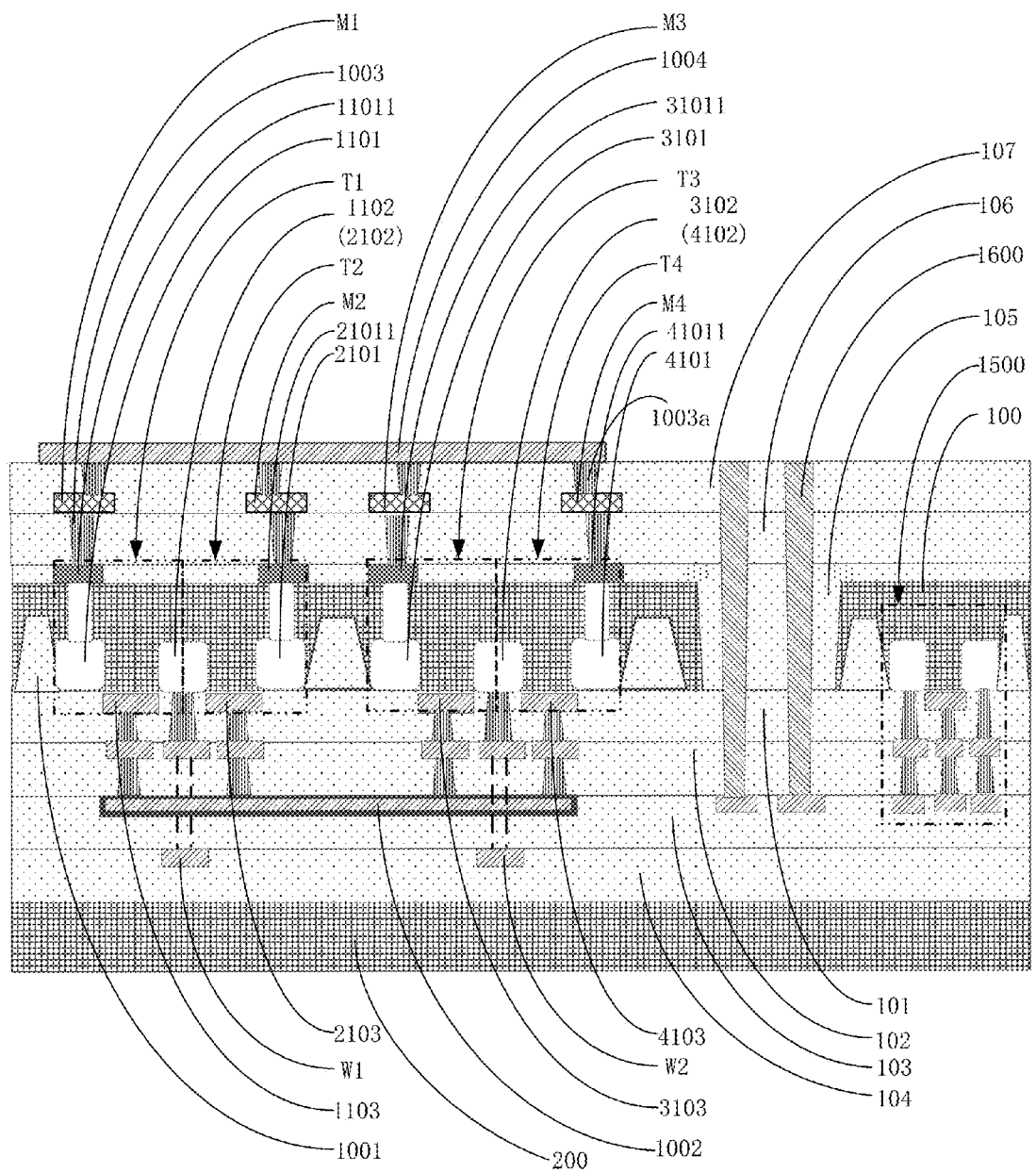
FIG. 2 is a simplified cross-sectional view of an integrated circuit structure according to a second embodiment of the present invention.
Figure 3:
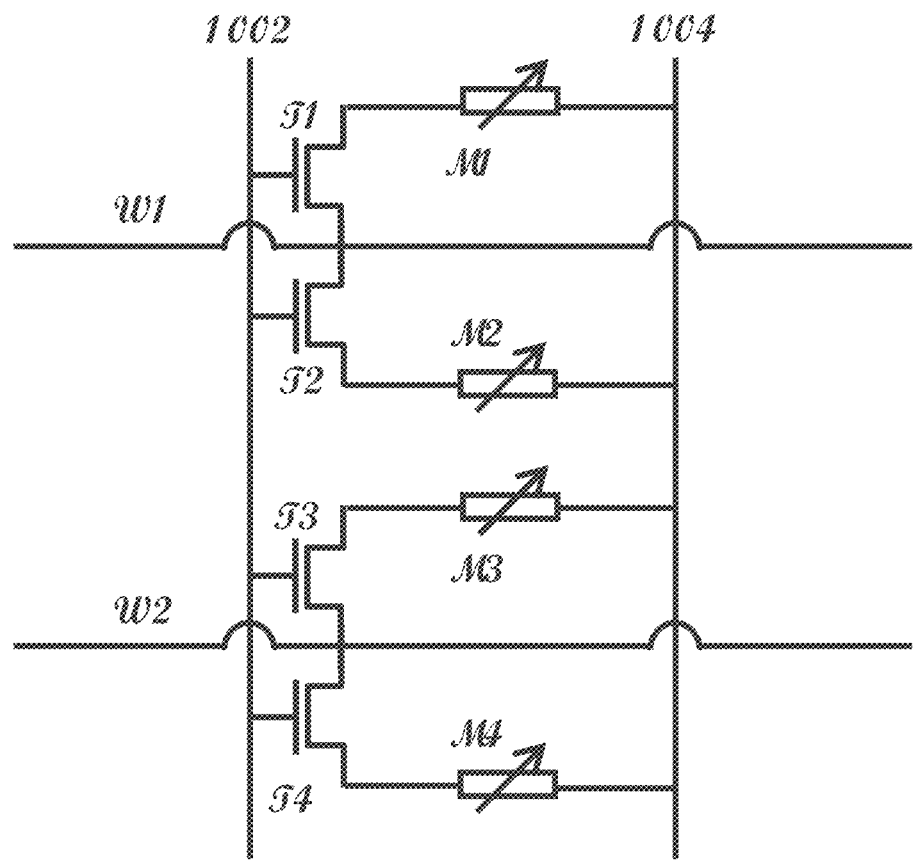
FIG. 3 is a simplified diagram of the integrated circuit structure of the second embodiment.

FIG. 2 is a simplified cross-sectional view of an integrated circuit structure according to a second embodiment of the present invention. FIG. 3 is a simplified circuit diagram of FIG. 2. Although FIGS. 2 and 3 only show the integrated circuit having four semiconductor memory control units, it is understood that the number of semiconductor memory control units can be any integer number. It is understood that the number is arbitrary chosen for describing the example embodiment and should not be limiting. The terms chip, integrated circuit, semiconductor device, and microelectronic device are often used interchangeably in this disclosure. The present invention is applicable to all the above as they are generally understood in the semiconductor field. The terms metal line, trace, wire, conductor, signal path and signaling medium are all related. The related terms listed above are generally interchangeable, and appear in order from specific to general. In this field, metal lines are sometimes referred to as traces, wires, lines, interconnect or simply metal.

Referring to FIG. 2, the integrated circuit includes a semiconductor substrate 100 and an array of storage control units on the semiconductor substrate. The array of storage control units includes a plurality of storage control units (four are shown in FIG. 2). Each of the storage control units includes a switching transistor and a resistive memory cell. Specifically, the array of storage control units includes a first storage control unit having a switching transistor T1 and a resistive memory cell M1, a second storage control unit having a switching transistor T2 and a resistive memory cell M2, a third storage control unit having a switching transistor T3 and a resistive memory cell M3, and a fourth storage control unit having a switching transistor T4 and a resistive memory cell M4.

The structure of each of the semiconductor memory control unit is substantially the same as the structure of the memory control unit of the first embodiment.

Switching transistor T1 of the first storage control unit includes a gate electrode 1103 disposed on semiconductor substrate 100, a source electrode 1102 and a drain electrode 1101 in the first surface of semiconductor substrate 100. Switching transistor T1 may also include connection terminals configured to connect associated gate electrode 1103 and source electrode 1102 (not shown in FIG. 2) and drain terminal 11011 configured to connect to drain electrode 1101 on the second surface of semiconductor substrate 100. Resistive memory cell M1 is disposed on the opposite second surface of semiconductor substrate 100 and is connected to drain electrode 1101 through drain terminal 11011.

Switching transistor T2 of the second storage control unit includes a gate electrode 2103 disposed on semiconductor substrate 100, a source electrode 2102 and a drain electrode 2101 in the first surface of semiconductor substrate 100. Switching transistor T2 may also include connection terminals configured to connect associated gate electrode 2103 and source electrode 2102 (not shown in FIG. 2) and drain terminal 21011 configured to connect to drain electrode 2101 on the second surface of semiconductor substrate 100. Resistive memory cell M2 is disposed on the second (apposite) surface of semiconductor substrate 100 and is connected to drain electrode 2101 through drain terminal 21011.

Switching transistor T3 of the third storage control unit includes a gate electrode 3103 disposed on semiconductor substrate 100, a source electrode 3102 and a drain electrode 3101 in the first surface of semiconductor substrate 100. Switching transistor T2 may also include connection terminals configured to connect associated gate electrode 3103 and source electrode 3102 (not shown in FIG. 2), and drain terminal 31011 configured to connect to drain electrode 3101 on the second surface of semiconductor substrate 100. Resistive memory cell M3 is disposed on the second (opposite) surface of semiconductor substrate 100 and is connected to drain electrode 3101 through drain terminal 31011.

Switching transistor T4 of the fourth storage control unit includes a gate electrode 4103 disposed on semiconductor substrate 100, a source electrode 4102 and a drain electrode 4101 in the first surface of semiconductor substrate 100. Switching transistor T4 may also include connection terminals configured to connect associated gate electrode 4103 and source electrode 4102 (not shown in FIG. 2), and drain terminal 41011 configured to connect to drain electrode 4101 on the second surface of semiconductor substrate 100. Resistive memory cell M4 is disposed on the second (opposite) surface of semiconductor substrate 100 and is connected to drain electrode 4101 through drain terminal 41011.

As shown in the exemplary embodiment, resistive memory cell M1 is disposed on a second surface of dielectric layer 105, drain terminal 11011 of switching transistor T1 is connected to the first end (e.g., first end 121 in FIG. 1) of resistive memory cell M1 through metal plug 1003. Resistive memory cells M2, M3, and M4 have structures that are similarly arranged as the structure of resistive memory cell M1.

In addition to these four semiconductor storage control units, the integrated circuit of the embodiment may further include more semiconductor memory control units having the same structure as the structure of these storage control units.

In an embodiment, the gate terminals in the array of semiconductor storage control units are connected together though a first wire, and the source terminals in the array of semiconductor storage control units are connected together though a second wire. Specifically, as shown in FIG. 2, the four semiconductor memory control units are disposed in the same line, the gate terminal of each of the switching transistors (actually gate electrode 1103 of switching transistor T1, gate electrode 2103 of switching transistor T2, gate electrode 3103 of switching transistor T3, gate electrode 4103 of switching transistor T4) is connected to a wire 1002. The source electrode (source terminal) of switching transistors T1, T2, T3, and T4) are individually connected to different wires. In an exemplary embodiment, switching transistors T1 and T2 have a common source structure (source electrodes 1102 and 2102 are commonly shared) that is connected to a line wire W1, switching transistor s T3 and T4 have a common source structure (source electrodes 3102 and 4102 are commonly shared) that is connected to a line wire W2.

Further, each of the resistive memory cells M1 through M4 has a second end that is connected to a reference voltage. As shown in FIG. 2, the second end of each resistive storage units is connected to a reference voltage supply wire that supplies a reference voltage to the resistive storage units.

In an embodiment, each wire (e.g., wire 1002) is connected to a voltage input select switch (not shown in FIG. 2), for example, column line wires such as W1 and W2 may be connected to a read signal sensing circuit (not shown in FIG. 2). Additionally, the row line wire (e.g., row line wire 1002) is connected to a voltage input select switch (not shown in FIG. 2), the column line wire (e.g., W1 and W2) are connected to an input signal control circuit (not shown in FIG. 2). In other words, the integrated circuit according to the present invention may further include other circuits or sub-circuits. For example, FIG. 2 shows a sub-circuit 1500 that can be a sensing sub-circuit.

In an embodiment, the source terminal, the drain terminal and the gate terminal of the switching transistor may not be present, and they may be represented by the respective source electrode, the drain electrode and the gate electrode. When the terminals are present, they may be a metal silicide, a metal or other suitable materials.

In an embodiment, each switching transistor may further include a body electrode disposed on the first surface of the semiconductor substrate. The body electrode may be a metal silicide or other suitable materials.

In an embodiment, each resistive memory (including M1, M2, M3, and M4) may include a thermal phase-change memory element with electric heating, a variable resistance storage element sensitive to voltage modulation, or a magnetoresistive memory element. When the resistive memory cell is a thermal phase change thermal storage element with electric current, the thermal phase-change memory element can be a germanium-antimony-tellurium alloy. When the resistive memory cell is a magnetoresistive memory cell, the resistive memory cell may be a magnetic tunnel junction device.

According to an embodiment of the present invention, the integrated circuit may also include a second dielectric layer 106 disposed on the second surface of semiconductor substrate 100, an interlayer dielectric layer 107 on second dielectric layer 106, and interlayer dielectric layers 101, 102, 103, and 104 sequentially disposed on the first surface of semiconductor substrate 100, a second semiconductor substrate 200 for supporting the integrated circuit, and other elements or layers such as the interconnecting metal layer, a metal plug, as shown in FIG. 2. A portion of interlayer dielectric layer 106 is through semiconductor substrate 100. In an exemplary embodiment, the integrated circuit further includes a through hole 1600 that is disposed outside the semiconductor memory control unit. Through hole 1600 is through interlayer dielectric layer 106 and interlayer dielectric layers 101, 102, and 107. In an embodiment, through hole 1600 is configured to connect devices disposed on the first surface and second surface of semiconductor substrate 100. In an embodiment, through hole 1600 may include one or more through holes. In this embodiment, through-hole 1600 is used to connect devices on the first surface with devices on the second surface. Through hole 1600 can be used to reduce the complexity of subsequent packaging processes. The integrated circuit according to embodiments of the present invention may include a shallow trench isolation 1001 and other structures.

FIG. 3 is a simplified circuit diagram of FIG. 2. The structures of the semiconductor memory cell array and the row and columns lines are shown. For example, M1 through M4 represent the four resistive memory cells, W1, W2 represent the row lines, and 1002, 1004 represents the column lines.

Due to the fact that the drain terminal and gate terminal are disposed on opposite sides of semiconductor substrate 100, the coupling capacitance between the gate and drain is reduced, thereby improving the performance and reducing the size of the integrated circuit. The production yield is also improved.

Third Embodiment

A method for manufacturing an integrated circuit will be described according to an exemplary embodiment of the present invention. The method of manufacturing an integrated circuit according to a third embodiment of the present invention will be described below. For example, the integrated circuit structure of FIG. 2 can be formed by the following steps:

Step A1: providing a semiconductor substrate 100 having a first surface and an opposite second surface; and forming a thin stop layer having a first depth on the first surface of semiconductor substrate 100.

In an embodiment, the first surface of semiconductor substrate 100 denotes the surface that includes a gate electrode of a transistor, the second surface of semiconductor substrate 100 denotes the surface that is opposite the first surface, the depth of the stop layer is measured in reference to the first surface. The term "a layer having a first depth H1" denotes the distance H1 measured between the top surface of that layer and the first surface of semiconductor substrate 100.

In this embodiment, first semiconductor substrate 100 generally is a bulk silicon substrate (bulk Si). The stop layer may be silicon oxide or other suitable materials.

In an embodiment, forming the thin stop layer may include the following steps:

Step A101: forming an oxygen ion layer with a depth H1 by injecting oxygen into the semiconductor substrate;

Step A102: submitting the semiconductor substrate to a heat treatment to convert the oxygen ion layer to a silicon oxide layer, which is the thin stop layer.

In another embodiment, the thin stop layer may also be formed using an epitaxial growth process.

In this embodiment, the stop layer is used mainly as a stop layer for a subsequent thinning process of first semiconductor substrate 100. In some embodiments, forming a stop layer may be omitted depending on applications.

Step A2: forming a shallow trench isolation (STI) 1001, shallow trench isolation 1001 may have a second depth H2. Second depth H2 is less than or equal first depth H1.

In certain embodiments, shallow trench isolation 1001 may include a plurality of shallow trench isolations each having a different depth.

Step A3: performing an ion implantation onto the first surface of semiconductor substrate 100 to form a well region and a channel.

Step A4: forming a gate dielectric layer, a gate and gate sidewalk on the first surface of semiconductor substrate 100. FIG. 2 shows gates 1103, 2103, 3103 and 4103. The gate dielectric layer and gate sidewalk are not shown for clarity reason.

Step A5: forming source electrodes (1102, 2102, 3102, and 4102) and drain electrodes (1101, 2101, 3101 and 4101) in semiconductor substrate 100.

Step A6: forming gate terminals and source terminals on the first surface of semiconductor substrate 100. Forming the gate and sources terminals can use any conventional metal silicide processes or other known processes. In an embodiment, step A6 may be omitted. In another embodiment, step A6 may include forming body electrodes on the first surface of semiconductor substrate 100.

Step A7: forming column lines (including column line 1002) and row lines (including row lines W1 and W2). Gate terminals disposed in the same column are connected to the same column line. Source terminals disposed in the same row are connected to the same row line.

Columns lines and row lines are separated from each other by an interlayer dielectric layer. Column lines and gate terminals are connected to each other through metal plugs, and row lines and source terminals are connected to each other through metal plugs. In other words, step A7 includes forming an interlayer dielectric layer and a metal interconnect structure.

Step A8: forming a second semiconductor substrate 200 (alternatively referred to as "carrier substrate") on the first surface of semiconductor substrate 100 (alternatively referred to as "first semiconductor substrate).

Step A9: performing a thinning process on the second surface (lower surface) of semiconductor substrate 100 to a first depth H1.

The thinning process to a first depth H1 refers to thinning the first semiconductor substrate 100 to a thickness that is substantially equal to the depth H1. The thinning process is stopped at stop layer 101, i.e., the portion of first semiconductor substrate 100 disposed above stop layer 101 is completely removed. In other words, the thinning process stops at the top surface of shallow trench isolation 1001.

In an embodiment, step A9 can be omitted if first semiconductor substrate 100 has an appropriate thickness.

Step A10: forming drain terminals on the second surface of the thinned semiconductor substrate 100 (including terminals 11011, 21011, 31011, and 41011). The drain terminals can be a metal silicide, metal or other suitable materials.

In an embodiment, the method may include, prior to forming the drain terminals, performing an ion implantation onto the drain region and submitting the semiconductor substrate to an annealing treatment. The purpose is to form a portion of drain electrode close to (in the vicinity of) the second surface of the first semiconductor substrate.

Step A11: forming a dielectric layer 105 on the second surface of semiconductor substrate 100.

In an embodiment, dielectric layer 105 includes a portion disposed on the second surface of semiconductor substrate 100 and a portion that is embedded in semiconductor substrate 100, as shown in FIG. 2. Dielectric layer 105 may be a silicon oxide layer.

Step A12: forming an interlayer dielectric layer 106, forming contact holes on drain terminals (including terminals 11011, 21011, 31011, and 41011) through dielectric layer 106, and forming metal plugs 1003.

Step A13: forming resistive storage units (including M1, M2, M3, and M4) on dielectric layer 106. The resistive storage units each have a first end connecting to drain terminals ((including terminals 11011, 21011, 31011, and 41011) through via plugs 103.

Step A14: forming an interlayer dielectric layer 107 on interlayer dielectric layer 106, forming silicon vias 1600 through dielectric layer 105, and interlayer dielectric layers 106, 107.

Silicon vias 1600 are used to connect devices disposed on the first surface with devices disposed on the second surface of semiconductor substrate 100. In an embodiment, silicon vias 1600 may go through a portion or all dielectric layers on the first surface of semiconductor substrate 100.

Step A15: forming contact holes on second ends of resistive storage units (M1, M2, M3, and M4) through interlayer dielectric layer 107, and forming metal plugs 1003a in the contact holes.

Step A16: forming a reference voltage wire 1004 that connects the second end of resistive storage units (M1, M2, M3, and M4) via metal plugs 1003a. Reference voltage wire 1004 provides a reference voltage to the resistive storage units.

The above steps complete the method of manufacturing an integrated circuit, as shown in FIG. 2.

It is understood that other alternatives can also be provided where steps are added, one of more steps are removed, or one or more steps are provided in a different sequence without departing from the scope of the claims herein.

Figure 4:
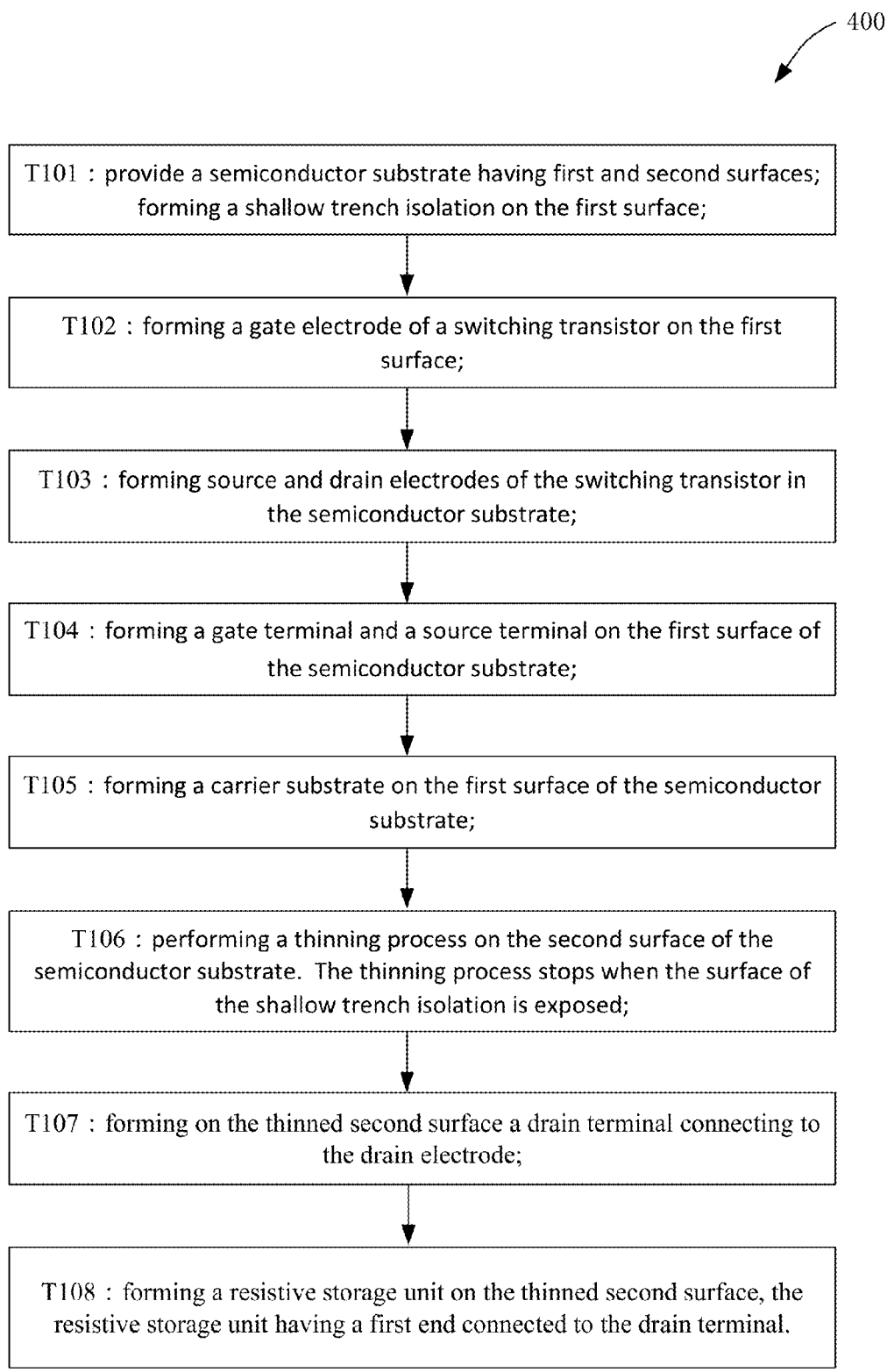
FIG. 4 is a flow chart of a method of manufacturing an integrated circuit structure of a third embodiment of the present invention

FIG. 4 is a flow chart of a method 400 for manufacturing an integrated circuit according to an embodiment of the present invention. Method 400 includes:

Step T101: providing a semiconductor substrate having a first surface and an opposite second surface, and forming a shallow trench isolation on the first surface;

Step T102: forming a gate electrode of a switching transistor on the first surface of the semiconductor substrate;

Step T103: forming a source electrode and a drain electrode of the switching transistor in the semiconductor substrate;

Step T104: forming a gate terminal on the gate electrode and a source terminal on the source electrode;

Step T105: forming a carrier substrate on the first surface of the semiconductor substrate;

Step T106: performing a thinning process on the second surface of the semiconductor substrate. The thinning process will stop when the surface of the shallow trench isolation is exposed;

Step T107: forming a drain terminal on the thinned second surface of the semiconductor substrate to connect to the drain electrode;

Step T108: forming a resistive storage unit on the thinned second surface of the semiconductor substrate, the resistive storage unit has a first end connected to the drain terminal.

The preferred embodiments of the present invention have been described for illustrative modification purposes, and those skilled in the art will appreciate that various modifications, additions and substitutions are possible, without departing from the scope and spirit of the invention as disclosed in the appended claims.

What is claimed is:

1. A semiconductor memory control unit comprising:
   a semiconductor substrate having a first surface and a second surface opposite the first surface;
   a switching transistor; and
   a resistive memory cell;
   wherein the switching transistor comprises:
      a gate disposed over the first surface of the semiconductor substrate;

a source and a drain each disposed in the semiconductor substrate, the drain comprising a first drain portion in the vicinity of the first surface and a second drain portion in the vicinity of the second surface;

a gate terminal disposed over the first surface and connected to the gate, a source terminal disposed over the first surface and connected to the source, a drain terminal disposed over the second surface of the semiconductor substrate and connected to the drain, and wherein the resistive memory cell is disposed over the second surface and has a first end connected to the drain terminal.

2. The semiconductor memory control unit of claim 1, wherein the first drain portion is wider than the second drain portion.

3. The semiconductor memory control unit of claim 1, wherein the first drain portion comprises a first ion implanted region in the vicinity of the first surface and the second drain portion comprises a second ion implanted region in the vicinity of the second surface.

4. The semiconductor memory control unit of claim 1, wherein the first drain portion and the second drain portion comprise a unitary structure of a deep ion implantation region from the first surface toward the second surface of the semiconductor substrate.

5. The semiconductor memory control unit of claim 1, wherein the source comprises a first portion in the vicinity of the first surface and a second portion in the vicinity of the second surface.

6. The semiconductor memory control unit of claim 1, further comprising a dielectric layer overlying the second surface, and the resistive memory cell is disposed over the dielectric layer.

7. The semiconductor memory control unit of claim 6, wherein the first end of resistive memory cell is connected to the drain terminal through a metal plug.

8. The semiconductor memory control unit of claim 1, further comprising a body electrode of the semiconductor substrate disposed over the first surface.

9. The semiconductor memory control unit of claim 1, further comprising a body electrode of the semiconductor substrate disposed over the second surface.

10. The semiconductor memory control unit of claim 1, wherein the gate terminal, the source terminal, and the drain terminal each comprises a metal silicide.

11. The semiconductor memory control unit of claim 1, wherein the resistive memory cell, the drain terminal, and the drain are disposed in a stacked structure perpendicular to the first surface of the semiconductor substrate.

12. The semiconductor memory control unit of claim 1, wherein the resistive memory cell comprises a thermal phase-change memory element with electric heating, a variable resistance memory element sensitive to voltage modulation, or a magnetoresistive memory element.

13. The semiconductor memory control unit of claim 12, wherein the thermal phase-change memory element comprises a germanium antimony tellurium alloy.

14. The semiconductor memory control unit of claim 1, wherein the resistive memory cell comprises a magnetic tunnel junction device.

15. An integrated circuit comprising:
an array of memory control units on a semiconductor substrate, each memory control unit comprising:
a switching transistor; and
a resistive memory cell,
wherein the switching transistor comprises:
a gate disposed on a first surface of the semiconductor substrate;
a source and a drain each disposed in the semiconductor substrate, the drain comprising a first drain portion in the vicinity of the first surface and a second drain portion in the vicinity of the second surface;
a gate terminal on the first surface connected to the gate,
a source terminal on the first surface connected to the source,
a drain terminal on a second surface connected to the drain terminal, the second surface disposed opposite the first surface, and
wherein the resistive memory cell is disposed on the second surface and has a first end connected to the drain terminal.

16. The integrated circuit of claim 15, wherein the switching transistor further comprises a body electrode of the semiconductor substrate disposed over the first surface or the second surface.

17. The integrated circuit of claim 15, wherein the resistive memory cell comprises a second end connected to a reference voltage.

18. The integrated circuit of claim 15, wherein the array of memory control units comprises:
gate terminals associated with memory control units disposed in a same row are connected through a row wire; and
source terminals associated with memory control units disposed in a same column are connected through a column wire.

19. The integrated circuit of claim 18, wherein the row wire is connected to a voltage input selector switch, and the column wire is connected to a readout signal sensing sub-circuit.

* * * * *

UNITED STATES PATENT AND TRADEMARK OFFICE
CERTIFICATE OF CORRECTION

PATENT NO. : 9,331,069 B2  
APPLICATION NO. : 14/826184  
DATED : May 3, 2016  
INVENTOR(S) : Herb He Huang Page 1 of 1

It is certified that error appears in the above-identified patent and that said Letters Patent is hereby corrected as shown below:

Title page

Under item (62), please insert the following.

--(30)     Foreign Application Priority Data

Sep. 27, 2013     (CN)     2012 1 0455095--

Signed and Sealed this  
Second Day of August, 2016

Michelle K. Lee  
*Director of the United States Patent and Trademark Office*